United States Patent [19]

Sonnenberger

[11] 4,384,305
[45] May 17, 1983

[54] CIRCUIT ARRANGEMENT FOR GENERATING A SYNCHRONIZABLE SAWTOOTH VOLTAGE

[75] Inventor: Paul Sonnenberger, Hamburg, Fed. Rep. of Germany

[73] Assignee: U.S. Philips Corporation, New York, N.Y.

[21] Appl. No.: 166,284

[22] Filed: Jul. 7, 1980

[30] Foreign Application Priority Data

Jul. 13, 1979 [DE] Fed. Rep. of Germany ....... 2928264

[51] Int. Cl.³ .............................................. H04N 5/04
[52] U.S. Cl. .................................... 358/158; 358/148; 307/228
[58] Field of Search ................ 358/158, 159, 148, 11, 358/21 R, 38, 140; 307/228; 315/364, 391; 331/20

[56] References Cited

U.S. PATENT DOCUMENTS

| | | | |
|---|---|---|---|
| 4,071,776 | 1/1978 | Isham | 307/228 |
| 4,134,082 | 1/1979 | Fernsler | 358/159 |
| 4,241,265 | 12/1980 | Ahmed | 307/228 |
| 4,253,116 | 2/1981 | Rodgers | 358/158 |
| 4,284,906 | 8/1981 | Manfredi | 307/228 |
| 4,319,276 | 3/1982 | Cense | 358/158 |

*Primary Examiner*—Michael A. Masinick
*Attorney, Agent, or Firm*—Thomas A. Briody; William J. Streeter; Laurence A. Wright

[57] ABSTRACT

A sawtooth voltage oscillator synchronizable by synchronizing pulses, a capacitor being charged and discharged, respectively, between two threshold values. The free-running frequency of the oscillator is switchable under the influence of a synchronizing signal detector which establishes the frequency of the synchronizing signal.

11 Claims, 3 Drawing Figures

CIRCUIT ARRANGEMENT FOR GENERATING A SYNCHRONIZABLE SAWTOOTH VOLTAGE

The invention relates to a circuit arrangement for generating a sawtooth-shaped voltage across a capacitor, comprising charging current means for charging said capacitor until a first threshold voltage is reached and discharging current means for subsequently discharging said capacitor until a second threshold voltage is reached, means for measuring and controlling the capacitor voltage, and means for switching said charging and discharging current means, respectively, at the instant a threshold voltage is reached, the free-running frequency of the sawtooth voltage thus produced being determined by the difference between said first and second threshold voltage at a constant charging and discharging current and by the intensity of said charging and discharging current, respectively, at a constant difference between said first and second threshold voltage.

BACKGROUND OF THE INVENTION

It is an object of the invention to make such a circuit arrangement which is known from United Kingdom patent specification No. 1,245,552, also suitable for different free-running frequencies. It is then possible to bring the natural frequency, i.e. in the absence of synchronizing pulses to substantially the nominal value. When the switching arrangement is for example used for deflection purposes in a television receiver, it is in this way prevented that the displayed picture runs rapidly so that it would not be viewable. When, however, the synchronizing pulses occur, the natural frequency has to be reduced and direct synchronization has then to be effected, so that a perfectly stationary picture is obtained. The amplitude or the energy content or the direct current component of the separated synchronizing pulses may be used for such a change-over.

Different television standards have different deflection frequencies. Particularly as regards the field deflection, the European television standard uses 50 Hz, consequently a period of 20 ms, whereas the United States television standard uses 60 Hz, which corresponds to a period of 16.67 ms. For receivers which must be suitable for use in a television receiving area wherein both standards are used, a change-over is, consequently, required. In south Germany it is, for example, possible to receive television signals of both standards in the same location, as there United States troops operate transmitters which operate on the basis of the NTSC system with a field deflection of 60 Hz.

Conventional television receivers do not require a special circuit arrangement for the deflection frequency as the line frequency is approximately the same for both standards. In the case of direct synchronization, the 60 Hz field frequency pulse arrives somewhat earlier, but it introduces a normal retrace. As, however, this synchronization occurs at an earlier instant on a rising sawtooth edge and, consequently, at a lower amplitude, it causes the amplitude of the field deflection to be reduced according to the ratio of the periods by approximately 17%, so that the picture geometry is correspondingly distorted.

A further object of the invention is to render it possible that, at a different frequency of the synchronizing signal, the sawtooth generator can be switched thus that the sawtooth amplitude remains substantially constant.

SUMMARY OF THE INVENTION

The invention provides a circuit arrangement of the above type comprising further a synchronizing signal detector for establishing the presence and the frequency of synchronizing pulses having a substantially constant nominal repetition frequency, whereby at least one of the two switching instants of the capacitor charging operation can be determined by means of said synchronizing pulses, the sawtooth voltage being thus synchronizable by means of said synchronizing pulses, and whereby it is established by means of the synchronizing signal detector whether the repetition frequency of the synchronizing pulses corresponds with a first, lower or a second higher value, at which second frequency value the charging current and/or the discharging current of the capacitor is increased in such a way that the amplitude of the sawtooth voltage is substantially the same for both frequencies.

DESCRIPTION OF THE DRAWINGS

The invention will now be further explained by way of example with reference to the accompanying drawing in which.

DETAILED DESCRIPTION OF THE PREFERRED EMBODIMENTS

Figure 1:
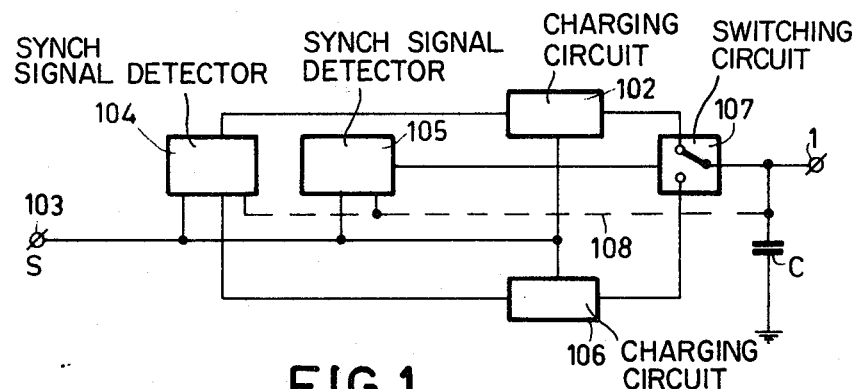
FIG. 1 shows a block schematic diagram of the invention.

FIG. 1 shows a circuit arrangement for producing a sawtooth voltage $v_c$ across a capacitor C which is connected to the output terminal 1, a charging current and a, preferably considerably larger, discharging current being alternately applied from a charging circuit 102 to this capacitor. This produces across capacitor C a voltage variation in accordance with the curve 111 which represents in FIG. 2 the capacitor voltage $v_c$ as a function of the time t. The charging portion starts at a low voltage value $V_2$ at an instant $t_o$ and increases time-proportionally.

When at an instant $t_2$ there is applied in the circuit shown in FIG. 1 from a terminal 103 a synchronizing pulse S having the nominal frequency of, for example, 50 Hz to the charging circuit 102, capacitor C receives a discharging current from, for example, also circuit 102, so that the discharge 112 starts at a voltage $V_1$, this discharge ending at an instant $t_3$, which corresponds to the instant $t_o$ and at which a new charging action starts. When, on the contrary, the frequency of the synchronizing signal has a second, higher value of, for example, 60 Hz, a synchronizing pulse—relative to the same start of the charging action $t_o$ and the same slope of the voltage increase—would occur at an earlier instant $t_4$ and introduce the discharge 113 to voltage $V_2$, which is shown at that instant by means of a dotted line. The sawtooth then reaches an amplitude $V_6$ which, compared with the value $V_1$ obtained at the first, lower frequency, is considerably lower.

According to the invention the synchronizing pulses S are applied from terminal 103 also to a (second) synchronizing signal detector 105; in addition, a second charging circuit 106 is provided whose output, and also the output of charging circuit 102, is connected to a switching stage 107. This switching stage comprises a change-over switch by means of which capacitor C and output terminal 1 can either be connected to charging circuit 102 or to charging circuit 106, depending on whether synchronizing signal detector 105 establishes whether synchronizing pulses S of the lower or of the higher frequency value occur. At the first, lower synchronizing signal frequency value the lower charging and, possibly, discharging current of stage 102 is applied to capacitor C. At the second, higher synchronizing signal frequency value the higher charging and, possibly, discharging current of the stage 106 is applied to capacitor C in such a way that at both frequencies the amplitude of the sawtooth voltage $v_c$ varies between the voltage values $V_2$ and $V_1$ and is, at least substantially, equal.

The circuit arrangement shown in FIG. 1 may comprise another (first) synchronizing signal detector 104, the subsequent charging stage (102 or 106) having been implemented so that, also without synchronization by means of pulses S, it effects periodically the charging and decharging of capacitor C with approximately the nominal frequency. The presence or absence of the synchronizing signal S is detected by the construction shown of the first synchronizing signal detector 104 and, in the absence of the synchronizing signal a first switching stage of the subsequent charging stage (102 or 106) is caused, in which the natural frequency corresponds, at least substantially, to the associated nominal repetition frequency of the synchronizing signal, whereas in the presence of the synchronizing signal the second switching state is caused, in which the natural frequency of the switching arrangement is lower with respect to the above-mentioned first state. Without synchronizing signal the relevant switching stage then oscillates at approximately the nominal frequency, whereas, in the case of missing synchronizing signals, its period is so much greater that direct synchronization is possible, also in the event the synchronizing pulses S applied from the outside have a somewhat longer period relative to the anticipated value (nominal value).

Figure 2:
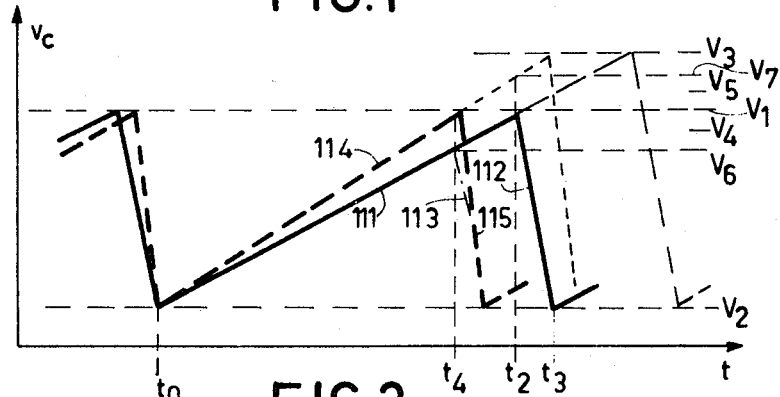
FIG. 2 shows the variation of a sawtooth voltage occurring in a circuit arrangement according to the invention.

Upon receipt of 60 Hz synchronizing signals the sawtooth generating circuit is switched thus, for example by means of stage 107 that the charging/discharging circuit 106 is operative for capacitor C, the sawtooth voltage $v_c$ varies from instant $t_o$ onwards in accordance with the curve 114 shown by means of a broken line in FIG. 2, and the discharging edge 115 starts at instant $t_4$ owing to the natural frequency or to external synchronization, so that a 60 Hz sawtooth is obtained. When the (first) synchronization signal detector 104 detects the presence of synchronizing pulses, the natural frequency may have been decreased to such an extent that the discharge would start as soon as a voltage $V_3$ is reached, the discharge 115 being, however, initiated as a prior instant by the synchronizing pulses S.

In a circuit arrangement as shown in FIG. 1 the synchronizing signal detector 105, and possibly, 104 may be separated from the charging circuits 102 and 106 and operate, for example, with a special sawtooth capacitor. It is, alternatively, possible to feed back the sawtooth voltage $v_c$, occurring at capacitor C, in accordance with the broken line 108 shown in FIG. 1, to the synchronizing signal-frequency detector 105 and, possibly, the detector 104 and to evaluate this sawtooth voltage; in, for example, an integrated circuit, the connection of an external capacitor C then requires only one terminal 1.

To this end the circuit may be of such a construction that when the device is switched on and synchronizing pulses are still absent, it produces a sawtooth voltage having the lower frequency of 50 Hz at capacitor C. When then 50 Hz synchronizing pulses S occur at the input terminal 103, the charging circuit 102 is switched by the first synchronizing pulse detector 104 in the described manner in such a way that, as shown by the curve 111 in FIG. 2, the period of the natural frequency is extended until the voltage $V_3$ has been reached and the discharge 112 is initiated at an earlier instant by the synchronizing pulse S. By means of a comparison circuit the sawtooth produced is compared with a voltage $V_4$ which is approximately halfway the voltage $V_1$, which is reached at 50 Hz synchronizing pulses, and the voltage $V_6$ at which the sawtooth edge 111 is prematurely ended by the discharge 113, when synchronizing pulses of the other frequency of 60 Hz are received. When this threshold voltage has detected, preferably several times, for example 5 to 20 times consecutively, a synchronization before the voltage $V_4$ is reached, the second operating condition for the synchronizing signals of the higher frequency of 60 Hz and, consequently, the transition to the curves 114, 115 in FIG. 2 is established, for example by means of the switch 107, capacitor C receiving in this condition a charging and, possibly, discharging current corresponding to the ratio of the frequencies.

When in the second switching condition for 60 Hz, the user switches to another transmitter with 50 Hz deflection, the situation is obtained that the synchronizing pulse on curve 114 initiates the discharge at instant $t_2$, so at approximately a voltage $V_7$. In this second operating condition there is operative in the second synchronization signal detector 105 a comparison circuit in which the sawtooth voltage is compared with a reference voltage which is located between the value $V_1$ necessary for the discharge and the value $V_7$, which is obtained in the case of incorrect synchronization, and approximately halfway at a voltage $V_5$. If this voltage is exceeded several times, for example 5 to 20 times consecutively, this means that a 50 Hz signal is received. Then the charging circuit 102 is made operative again, for example by means of the switching stage 107. The number of times the above voltage is exceeded can be counted by means of a counter which is reset when this voltage is not exceeded for several times.

When the synchronizing pulses disappear after a normal reception, for example, when switching to another transmitter, the circuit, the change-over switch 107 in particular, retains its position, until an other transmitter is received. As no satisfactory picture can be displayed without synchronizing signals, it may be useful to change always back to the lower frequency in this condition, so that, for example, no change of the natural frequency for the 60 Hz charging circuit is necessary.

Figure 3:
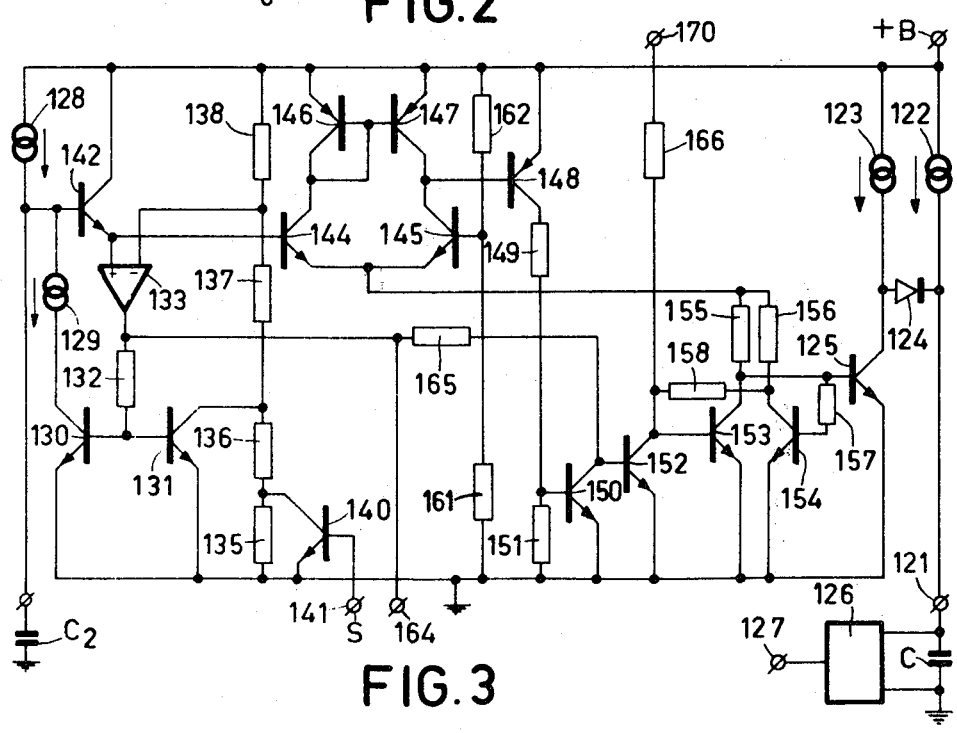
FIG. 3 shows a detailed embodiment of the invention.

FIG. 3 shows an embodiment of the invention in which the synchronizing signal detector for the determination of the frequency operates with a sawtooth voltage generated at a second capacitor $C_2$ of, for example, 470 nF. The capacitor C at which the sawtooth voltage having an amplitude adjusted in dependence on the frequency occurs, is connected between chassis (ground) and an output terminal 121 and receives a constant current from the +B 9 volts battery voltage via a first current source 122, the voltage increase during the charging action being produced with this current for the lower frequency of 50 Hz. A second current source 123 from the supply source +B is arranged in parallel with source 122 via a diode 124 for the charge increase at the higher frequency of 60 Hz, when an npn-transistor 125 connected between the current source 123 and ground is non-conductive. The discharge of the sawtooth voltage is produced by means of a discharging circuit 126, which is arranged in parallel with capacitor C and is controlled by synchronizing pulses at a terminal 127.

A third current source 128 is connected between the voltage source +B and capacitor $C_2$ whose other side is connected to ground. This causes a voltage which increases linearly from a lower value $V_{12}$ to be produced at capacitor $C_2$ during charging. The series arrangement of a fourth current source 129 and the collector-emitter path of an npn-transistor 130 is arranged in parallel with capacitor $C_2$, the base of the transistor being connected to the base of a further npn-transistor 131 and to the output of an operational amplifier 133 via a resistor 132. The emitters of the transistors 130 and 131 are connected to ground. The voltage divider comprising the resistors 135, 136, 137 and 138 of 2.2, 2.6, 1.5 and 2.75 kohm, respectively, is arranged in parallel between ground and +B. The collector emitter path of an npn-transistor 140 is in parallel with resistor 135, the base of this transistor receiving from a terminal 141 synchronizing signals S which consist, for example, of pulses which are supplied with an internal resistance of 10 kOhm by a source, not shown, whose voltage is 0.1 volt in the charge interval and +1 volt or more in the pulse interval. The collector of transistor 131 is connected to the tapping point between resistors 136 and 137 and the inverting input of operational amplifier 133 is connected to the taping point between resistors 137 and 138. The other (direct) input of amplifier 133 is connected to the voltage source +B via the emitter-collector path of an pnp-transistor 142, the base of transistor 142 being connected to the voltage-carrying electrode of capacitor $C_2$. The emitter of transistor 142 which, as emitter follower, transfers approximately the capacitor voltage is furthermore connected to the base of a transistor 144 which, together with a transistor 145, forms a differential amplifier with interconnected emitters. A current mirror circuit formed by two pnp-transistors 146 and 147, whose emitters are connected to the voltage source +B is connected in the collector branches of transistors 144 and 145, this current mirror circuit transferring the conductive stage of transistor 144 to transistor 147 which acts as output resistance for transistor 145.

The collector of transistor 145 is connected to the base of a pnp-transistor 148, the emitter of which is connected to +B, and the collector, via a 56 kOhm-resistor 149 to the base of an npn-transistor 150, the emitter of which is connected to ground, and to a 20 kOhm-resistor 151, the other end of which is also connected to ground.

The collector of transistor 150 is connected to the base of an npn-transistor 152, the emitter of which is connected to ground and the collector to the base of an npn-transistor 153. The emitter of transistor 153 as well as the emitter of a further npn-transistor 154, are connected to ground. The collectors of transistors 153 and 154 are connected to the interconnected emitters of transistors 144 and 145 via resistors 155 and 156, respectively, each having a resistance value of 45 kOhm, and also to the base of the other transistor via 17 kOhm-resistor 157 and 15 kOhm-resistor 158, respectively. Transistors 144, 145 and 153, 154, respectively, convey approximately the same current, so that they can be arranged in series, in spite of their independent controls.

The base of transistor 145 is connected to the tapping point of a voltage divider connected between ground and +B and comprises of the resistors 161 of 5.95 kOhm and 162 of 3.1 kOhm, which point carries a voltage of 5.8 volt. The output of operational amplifier 133 is connected on the one hand to an output terminal 164 and on the other hand to the base of transistor 152 via a 33 kOhm-resistor 165. A pulse which is positive during the discharge occurs at terminal 164, possibly via an amplifier, it being possible to use this pulse for, for example, blanking of a picture tube during the field flyback.

The circuit of FIG. 3 operates as follows: A constant charging current is applied to capacitor $C_2$ by current source 128 such that the voltage increases time-proportionally from a lower value $V_{12}$. The voltage then varies approximately in accordance with the curve 111 in FIG. 2. In the further course of the description voltage values which correspond approximately to those of FIG. 1, are denoted by reference numeral increased by 10, so that $V_2$ in FIG. 2 now corresponds to a voltage $V_{12}$. This voltage is transferred to the direct input of amplifier 133 via transistor 142, which operates as an emitter follower. When the voltage at capacitor $C_2$ reaches approximately the value $V_{13} - v_{be}$ present at the tapping point between resistors 137 and 138, amplifier 133 becomes conductive and transistors 130 and 131 conduct current. $v_{be}$ is the voltage of approximately 0.7 volt which is present between the base and emitter when the transistor is conductive. Transistor 130 then switches on current source 129, which derives a current, which is the larger as the discharge slope is steeper, for discharging the capacitor $C_2$. Transistor 131 short-circuits resistors 135 and 136 thus that the voltage at the tapping point between resistors 137 and 138 of, originally, 6.3 Volts decreases to approximately the value $V_{12} - v_{be}$ of 3.2 Volts. When the voltage at capacitor $C_2$ has reached the value $V_{12}$, amplifier 133 and transistors 130 and 131 are cutoff, the discharge ends and a new charging action is initiated.

The voltage $V_{13}$ is reached only then when no synchronization is obtained. Resistor 135 is shunted by transistor 140 which is driven from the non-conductive to the conductive state by means of a synchronizing pulse S which is received from terminal 141. This causes the voltage between resistors 137 and 138 to decrease. At the end of the charging action the voltage at capacitor $C_2$ has already reached a higher value thus, that on switching by means of the synchronizing pulse S the voltage at the inverting input of amplifier 133 is decreased to such an extent that amplifier 133 conducts and the above-described discharge is initiated. Normally, the synchronizing pulse S is shorter than the discharge period determined by the discharge by means of current source 129. Also for longer synchronizing pulses charging is switched on again at the end of the discharge.

At the start of the discharge period a narrow, positive setting pulse having, for example, a duration of 2 μsec, is released via a 12 kOhm-resistor 166, from a terminal 170 which may also be a connection to another circuit portion integrated on the same semiconductor body, this setting pulse being, for example, derived from the field deflection circuit, the width of this pulse being small relative to the normal flyback period. It has, for example, a peak value of 5.2 Volts relative to a basic value of 0.2 Volt.

Transistors 153 and 154 provide a self-sustaining switching stage thus that when transistor 153 is rendered conductive by the above-mentioned setting pulse from circuit point 170, transistor 154 is cutoff and a voltage of, for example, +0.3 Volt is produced at the collector of transistor 153 and, consequently, at the base of transistor 125, this voltage also keeping transistor 125 in the non-conductive stage. Then the current flows from current source 123 via diode 124 together with the current of source 122 to capacitor C, which results in a more rapid voltage increase than desired for 60 Hz operation. The current of source 123 is approximately 1/5 of the current of source 122 so that the ratio between the current of source 122 and the sum current of sources 122 and 123 is 5:6.

At the tapping point of voltage divider 161, 162 there is a voltage $V_{14}-v_{be}$ which is between the lower voltage $V_{16}$ at which the discharge of the voltage of capacitor $C_2$ is initiated at 60 Hz, and the value $V_{11}$ at which the discharge of capacitor $C_2$ starts at 50 Hz operation. For the period of time the voltage at capacitor $C_2$ is lower than $V_{14}$ transistor 144 is non-conductive and a lower voltage is present at the collector of transistor 145. The voltage renders transistors 148 and 150 conductive, so that transistor 152 does not conduct current, neither does it carry a current when a positive current flows during the discharge from the output of amplifier 133 via the resistor 165 to the junction point of the collector of transistor 150 and the base of transistor 152. The switching stage comprising the transistor 153 and 154 may therefore remain in the 60 Hz state, or is switched to this state, by the above-described setting pulse.

When, however, the synchronizing pulse during 50 Hz operation does not occur until transistor 144 has become conductive via emitter follower 142 in response to the voltage at capacitor $C_2$, transistor 145, 148 and 150 are cutoff. The voltage increase produced at the output of amplifier 133 in the case of synchronization from terminal 141 then renders transistor 152 conductive during the discharge period via resistor 165, which cancels the action of the 60 Hz setting pulse 170 and renders transistor 153 non-conductive. As a result thereof the collector voltage of transistor 153 increases and transistor 125 is opened, so that from now on the charging current required for 60 Hz operation is derived from source 123 and only the current of source 122, necessary for 50 Hz operation, flows to capacitor C.

In this circuit the setting pulse at point 170 tries to establish the 60 Hz operation in each interval. However, this is prevented by means of the differential amplifier 144, 145 for the period of time the voltage of capacitor $C_2$ exceeds the switching value $V_{14}$ determined by the voltage divider 161, 162 and the 50 Hz operation is established by the control via resistor 165, this 50 Hz operation being maintained by the self-sustaining construction of the switch with transistors 153, 154. When the synchronizing pulses having a frequency of 60 Hz appear, transistor 144 is not opened, transistors 145, 148 and 150 conduct thus that transistor 152 is cutoff and the setting pulse can adjust the switching stage 153, 154 to the 60 Hz state via resistor 166, the switching stage then remaining Also the circuit shown in FIG. 3 is preferably implemented predominantly in integrated technique.

What is claimed is:

1. A circuit arrangement for generating a sawtooth-shaped voltage across a capacitor comprising:

charging current means connected to said capacitor for charging said capacitor until a first threshold voltage is reached and discharging current means connected to said capacitor for subsequently discharging said capacitor until a second threshold voltage is reached, means connected to said charging and discharging means for measuring and controlling the capacitor voltage, means connected to said capacitor for switching said charging and discharging current means, respectively, at the instant a threshold voltage is reached, the free-running frequency of the sawtooth voltage thus produced being determined by the difference between said first and second threshold voltage at a constant charging and discharging current and by the intensity of said charging and discharging current, respectively, at a constant difference between said first and second threshold voltage, the circuit arrangement comprising further a source of synchronizing pulses connected to said circuit, and a synchronizing signal detector connected to said current charging and discharging means for establishing the presence and the frequency of synchronizing pulses having a substantially constant nominal repetition frequency, whereby at least one of the two switching instants of the capacitor charging operation can be determined by means of said synchronizing pulses, the sawtooth voltage being thus synchronizable by means of said synchronizing pulses, and whereby it is established by means of said synchronizing signal detector whether the repetition frequency of said synchronizing pulses corresponds with a first lower or a second higher value, at which second frequency value the charging current and/or the discharging current of said capacitor is increased in such a way that the amplitude of the sawtooth voltage is substantially the same for both frequencies.

2. A circuit arrangement as claimed in claim 1, wherein the charging current is increased in correspondence with the ratio of the frequencies.

3. A circuit arrangement as claimed in claim 2 wherein a sawtooth voltage having a constant slope is produced for the synchronizing signal detector, the discharge thereof being initiated by a synchronizing pulse so that the sawtooth reaches a first amplitude value at the second frequency value and a higher amplitude value at the second frequency value, respectively, and wherein a switching stage stops the operation at the higher frequency when a limit value is not exceeded and stops the operation at the lower frequency when the limit value is exceeded.

4. A circuit arrangement as claimed in claim 3, wherein the frequency adjustment is effected during each period in the interval between the end of the charge and the start of the discharge.

5. A circuit arrangement as claimed in claims 3 or 4, wherein pulses for the frequency adjustment are applied at the beginning of the discharge.

6. A circuit arrangement as claimed in claim 5, wherein short setting pulse is produced at the start of the discharge for switching into the operation at higher frequency.

7. A circuit arrangement as claimed in claim 5 wherein a pulse occurring during the discharge period is used for switching into the operation at lower frequency.

8. A circuit arrangement as claimed in any of the claim 5, wherein the short setting pulse is supressed by the longer setting pulse at the occurrence of this longer setting pulse.

9. A circuit arrangement as claimed in claim 1, wherein the current source for the higher charging current is connected to the capacitor via a diode, a switch conducting current when the lower current is to be applied to the capacitor being provided between the junction point of said current source and said diode and the other terminal of the capacitor.

10. A circuit arrangement as claimed in claim 5, wherein a bistable multivibrator stage is used for frequency-switching purposes.

11. A circuit arrangement as claimed in claim 1 or 2, wherein the generated signal is used for the synchronizing signal detector in such a way that on adjustment to the lower frequency the switching threshold value is located at a sawtooth amplitude which is below the value normally occurring at the lower frequency and that on adjustment to the higher frequency value switching is effected when the sawtooth amplitude reaches at the beginning of the discharge a value which is considerably above the value normally occurring at the higher frequency.

* * * * *